US012772803B2

(12) United States Patent
Blin et al.

(10) Patent No.: US 12,772,803 B2
(45) Date of Patent: Oct. 20, 2026

(54) SEMICONDUCTOR WAFER HAVING CONTACT PADS CONFIGURED TO ACT AS PROBE PADS

(71) Applicant: Skyworks Solutions, Inc., Irvine, CA (US)

(72) Inventors: Guillaume Alexandre Blin, Carlisle, MA (US); Engin Ibrahim Pehlivanoglu, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 304 days.

(21) Appl. No.: 18/105,019

(22) Filed: Feb. 2, 2023

(65) Prior Publication Data

US 2023/0253271 A1 Aug. 10, 2023

Related U.S. Application Data

(60) Provisional application No. 63/306,895, filed on Feb. 4, 2022, provisional application No. 63/306,899, filed (Continued)

(51) Int. Cl.

| | |
|---|---|
| ***H01L 21/66*** | (2006.01) |
| ***G01R 1/073*** | (2006.01) |
| ***G01R 31/26*** | (2020.01) |
| ***G01R 31/28*** | (2006.01) |
| ***H01L 23/48*** | (2006.01) |
| ***H01L 23/525*** | (2006.01) |
| ***H01L 23/58*** | (2006.01) |

(Continued)

(52) U.S. Cl.

CPC ........ *H10P 74/273* (2026.01); *G01R 1/07342* (2013.01); *G01R 31/2601* (2013.01); *G01R 31/2884* (2013.01); *H10P 74/207* (2026.01); *H10P 74/23* (2026.01); *H10P 74/277* (2026.01); *H10W 20/20* (2026.01); *H10W 42/00* (2026.01); *H10W 90/00* (2026.01); *H10B 20/25* (2023.02); *H10W 20/493* (2026.01)

(58) Field of Classification Search

CPC ......... H01L 22/22; H01L 22/32; H01L 21/78; H10B 20/25

See application file for complete search history.

(56) References Cited

U.S. PATENT DOCUMENTS

| | | | | |
|---|---|---|---|---|
| 4,903,111 A * | 2/1990 | Takemae | G11C 29/785 365/96 |
| 5,389,556 A * | 2/1995 | Rostoker | G01R 31/2884 324/750.05 |

(Continued)

*Primary Examiner* — Evren Seven

(74) *Attorney, Agent, or Firm* — VIA LLP

(57) ABSTRACT

A semiconductor wafer comprising a first die including a first integrated circuit having a trimmable or programmable component. The trimmable or programmable component is configured to be trimmed or permanently altered in response to an electrical signal. The semiconductor wafer includes a second die arranged adjacent to the first die. The second die includes a second integrated circuit and at least one contact pad arranged to allow an electrical connection to be made to the second integrated circuit. The at least one contact pad is additionally electrically connected to the at least one trimmable or programmable component of the first die such that the at least one contact pad of the second die is configured to act as a probe pad.

20 Claims, 9 Drawing Sheets

Related U.S. Application Data on Feb. 4, 2022, provisional application No. 63/306,926, filed on Feb. 4, 2022, provisional application No. 63/306,880, filed on Feb. 4, 2022.

(51) Int. Cl.

| | |
|---|---|
| ***H01L 25/065*** | (2023.01) |
| ***H10B 20/25*** | (2023.01) |
| ***H10P 74/00*** | (2026.01) |
| ***H10P 74/20*** | (2026.01) |
| ***H10W 20/20*** | (2026.01) |
| ***H10W 20/49*** | (2026.01) |
| ***H10W 42/00*** | (2026.01) |
| ***H10W 90/00*** | (2026.01) |

(56) References Cited

U.S. PATENT DOCUMENTS 5,442,282 A 8/1995 Rostoker et al.
5,648,661 A * 7/1997 Rostoker .............. G11C 29/006 257/665
5,965,902 A 10/1999 Beffa
6,121,677 A * 9/2000 Song ....................... H01L 24/02 257/692
6,427,222 B1 7/2002 Shau
6,492,666 B2 * 12/2002 Terada .................... H01L 22/32 257/209
7,563,694 B2 * 7/2009 Burnside ................. H01L 22/32 438/113
8,378,346 B2 * 2/2013 Pagani .................... H01L 22/32 257/E21.531
8,532,602 B2 9/2013 Pehlivanoglu et al.
8,922,268 B2 12/2014 Madan et al.
8,975,950 B2 3/2015 Madan et al.
9,013,225 B2 4/2015 Madan et al.
9,048,786 B2 6/2015 Pehlivanoglu et al.
9,148,194 B2 9/2015 Madan et al.
9,160,328 B2 10/2015 Altunkilic et al.
9,246,437 B2 1/2016 Pehlivanoglu et al.
9,276,570 B2 3/2016 Madan et al.
9,450,579 B2 9/2016 Madan et al.
9,495,631 B1 * 11/2016 Koepp ............. G06K 19/07752
9,509,363 B2 11/2016 Madan et al.
9,620,424 B2 4/2017 Blin et al.
9,628,075 B2 4/2017 Cebi et al.
9,685,943 B2 6/2017 Madan et al.
9,721,936 B2 8/2017 Zhu et al.
9,741,653 B2 8/2017 Roy et al.
9,837,324 B2 12/2017 Blin et al.
9,852,978 B2 12/2017 Roy et al.
9,923,594 B2 3/2018 Madan et al.
9,973,184 B2 5/2018 Madan et al.
10,032,731 B2 7/2018 Fuh et al.
10,050,653 B2 8/2018 Pehlivanoglu et al.
10,056,901 B2 8/2018 Roy et al.
10,103,495 B2 10/2018 Blin et al.
10,147,724 B2 12/2018 Madan et al.
10,171,045 B2 1/2019 Pehlivanoglu et al.
10,229,902 B2 3/2019 Zhu et al.
10,230,332 B2 3/2019 Pehlivanoglu et al.
10,255,982 B2 4/2019 Zhou et al.
10,284,200 B2 5/2019 Roy et al.
10,340,861 B2 7/2019 Ye et al.
10,347,350 B2 7/2019 Zhou et al.
10,360,988 B2 7/2019 Zhou et al.
10,437,774 B2 10/2019 Obkircher et al.
10,447,151 B2 10/2019 Zhou et al.
10,490,294 B2 11/2019 Zhou et al.
10,498,319 B2 12/2019 Zhou et al.
10,541,682 B2 1/2020 Popplewell et al.
10,580,705 B2 3/2020 Blin et al.
10,615,756 B2 4/2020 Pehlivanoglu et al.
10,637,412 B2 4/2020 Ye et al.
10,643,727 B2 5/2020 Zhou et al.
10,693,459 B2 6/2020 Blin et al.
10,700,063 B2 6/2020 Blin et al.
10,826,546 B2 11/2020 Pehlivanoglu et al.
10,840,233 B2 11/2020 Zhu et al.
10,880,116 B2 12/2020 Zhou et al.
10,886,880 B2 1/2021 Pehlivanoglu et al.
10,963,418 B2 3/2021 Obkircher et al.
11,038,096 B2 6/2021 Modi et al.
11,043,432 B2 6/2021 Blin et al.
11,056,210 B1 * 7/2021 Laisne ................. H10D 84/204
11,115,015 B2 9/2021 Zhou et al.
11,159,158 B2 10/2021 Popplewell et al.
11,211,335 B2 12/2021 Park et al.
11,217,581 B2 1/2022 Blin et al.
11,289,432 B2 3/2022 Fuh et al.
11,296,688 B2 4/2022 Blin et al.
11,303,253 B2 4/2022 Pehlivanoglu et al.
11,314,685 B2 4/2022 Obkircher et al.
11,316,550 B2 4/2022 Liang et al.
11,329,609 B2 5/2022 Johnson et al.
11,394,384 B2 7/2022 Blin et al.
11,444,026 B2 9/2022 Zhou et al.
11,539,288 B2 12/2022 Zhou et al.
11,664,839 B2 5/2023 Pehlivanoglu et al.
11,671,136 B2 6/2023 Liang et al.
11,682,699 B2 6/2023 Roy et al.
11,785,853 B2 10/2023 Modi et al.
11,810,874 B2 11/2023 Fuh et al.
11,811,438 B2 11/2023 Nisbet et al.
11,817,456 B2 11/2023 Blin et al.
11,901,243 B2 2/2024 Blin et al.
11,916,303 B2 2/2024 Kovacic et al.
11,916,518 B2 2/2024 Johnson et al.
11,936,416 B2 3/2024 Liang et al.
11,942,682 B2 3/2024 Kovacic et al.
11,942,861 B2 3/2024 Zhou et al.
11,953,926 B2 4/2024 Liang et al.
11,967,896 B2 4/2024 Blin et al.
11,973,115 B2 4/2024 Roy et al.
12,525,492 B2 1/2026 Blin et al.
12,604,709 B2 4/2026 Blin et al.
2003/0062591 A1 * 4/2003 Jensen ................ H01L 23/5256 257/E23.149
2005/0239268 A1 * 10/2005 Pirkle ..................... H01L 21/78 438/460
2005/0248000 A1 * 11/2005 Chen ....................... H01L 22/32 257/620
2007/0243643 A1 * 10/2007 Rolda ..................... H01L 22/32 438/18
2009/0140391 A1 6/2009 Hou et al.
2010/0084751 A1 4/2010 Frederick et al.
2010/0085107 A1 * 4/2010 Huang ................... H01H 85/30 327/525
2012/0313690 A1 12/2012 Hall et al.
2012/0326146 A1 * 12/2012 Hui ......................... H01L 22/32 257/E29.325
2013/0020674 A1 * 1/2013 Leal ...................... H01L 23/585 257/E23.149
2013/0026466 A1 * 1/2013 Pagani .................... H01L 24/05 257/E23.179
2013/0037968 A1 * 2/2013 Ishida ................... H01L 23/564 257/E23.179
2014/0009210 A1 1/2014 Madan et al.
2014/0009212 A1 1/2014 Altunkilic et al.
2014/0015111 A1 * 1/2014 Ho ...................... H01L 23/3185 257/620
2014/0077320 A1 * 3/2014 Chen ..................... H01L 23/585 257/E23.179
2015/0171860 A1 6/2015 Blin et al.
2016/0126199 A1 5/2016 Roy et al.
2016/0178666 A1 6/2016 Oh
2017/0082684 A1 * 3/2017 Pagani .................... H01L 22/34
2018/0062582 A1 3/2018 Pehlivanoglu et al.
2018/0122754 A1 5/2018 Tatour et al.
2018/0180665 A1 * 6/2018 Delacruz ............ G01R 31/2894
2018/0315723 A1 * 11/2018 Singh ...................... H01L 24/06
2019/0107575 A1 * 4/2019 Pagani .................... H01L 24/05
2019/0158028 A1 5/2019 Pehlivanoglu

(56) References Cited

U.S. PATENT DOCUMENTS

2019/0180833 A1 6/2019 Zhou et al.
2019/0181063 A1 6/2019 Liao et al.
2019/0253054 A1 8/2019 Roy et al.
2019/0304967 A1* 10/2019 Chang .................... H01L 22/34
2019/0386005 A1 12/2019 Madan et al.
2019/0386104 A1 12/2019 Roy et al.
2021/0203322 A1 7/2021 Blin et al.
2021/0348684 A1 11/2021 Yao et al.
2022/0013415 A1 1/2022 Blin et al.
2022/0254812 A1 8/2022 Wang et al.
2022/0321151 A1 10/2022 Zhu et al.
2022/0344833 A1 10/2022 Blin et al.
2022/0345172 A1 10/2022 Blin et al.
2022/0352888 A1 11/2022 Blin et al.
2022/0385249 A1 12/2022 Brunel et al.
2022/0413533 A1 12/2022 Liang et al.
2022/0416084 A1 12/2022 Ye et al.
2023/0009677 A1 1/2023 Wang et al.
2023/0012894 A1 1/2023 Liang et al.
2023/0014555 A1 1/2023 Liang et al.
2023/0038733 A1 2/2023 Blin et al.
2023/0066905 A1* 3/2023 Huang ............... G01R 31/2884
2023/0085532 A1 3/2023 Zhou et al.
2023/0100609 A1 3/2023 Liang et al.
2023/0107607 A1 4/2023 Nisbet et al.
2023/0187289 A1* 6/2023 Momota ............ H01L 23/5286
257/48
2023/0208044 A1 6/2023 Brunel et al.
2023/0238385 A1 7/2023 Wang et al.
2023/0253270 A1 8/2023 Blin et al.
2023/0253991 A1 8/2023 Blin et al.
2023/0280372 A1 9/2023 Blin et al.
2023/0282529 A1 9/2023 Blin et al.
2023/0361055 A1 11/2023 Chen et al.
2023/0361113 A1 11/2023 Lam et al.
2023/0420332 A1 12/2023 Blin et al.
2024/0038865 A1 2/2024 Blin et al.
2024/0039531 A1 2/2024 Blin et al.
2024/0056056 A1 2/2024 Blin et al.
2024/0079314 A1 3/2024 Wang et al.
2024/0113051 A1 4/2024 Blin et al.
2024/0113168 A1 4/2024 Blin
2024/0113169 A1 4/2024 Blin
2024/0113170 A1 4/2024 Blin
2024/0113180 A1 4/2024 Blin
2024/0113181 A1 4/2024 Blin
2024/0113190 A1 4/2024 Blin et al.
2024/0113735 A1 4/2024 Nisbet et al.
2024/0114794 A1 4/2024 Modi et al.
2024/0128132 A1 4/2024 Miwa et al.
2024/0153891 A1 5/2024 Fuh et al.
2024/0153946 A1 5/2024 Blin et al.
2024/0363454 A1* 10/2024 Yang ...................... H01L 21/78
2025/0054818 A1* 2/2025 Ogawa .................... H01L 22/34

* cited by examiner

SEMICONDUCTOR WAFER HAVING CONTACT PADS CONFIGURED TO ACT AS PROBE PADS

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Field

Embodiments of the invention relate to the testing and trimming of integrated circuits on semiconductor wafers.

Description of the Related Technology

In semiconductor manufacture, dies are formed on semiconductor wafers using a reticle. A reticle comprises a transparent substrate on which a patterned opaque coating is formed to define an image which is to be projected on to the wafer. The image contains one or more dies and each die includes a primary die area that is patterned according to an integrated circuit design. The reticle is placed into a projection system and exposed to radiation, such as ultraviolet light, to project the image on to an area of the wafer. The area of the wafer on to which the image of the reticle is projected is called the field area. Multiple field areas can be formed adjacent to one another by stepping the reticle across the wafer. Multiple patterned processing layers can be added to the wafer to form an integrated circuit within each die on the wafer.

A semiconductor device or package may be fully assembled, or substantially fully assembled, whilst the integrated circuit is still part of the wafer, that is, before the wafer is diced into separate devices each comprising a single die. Such a package may be referred to as a wafer-level chip-scale package (WLCSP). The term “chip-scale package” refers to the fact that the semiconductor package is substantially the same size as, or only marginally larger than, the size of the die. To form a WLCSP, all necessary components are added to the die on the wafer. Such components may include electrical interconnects, additional circuitry, redistribution layers, etc. Contact pads are added for each die to provide electrical connection to the integrated circuit and solder bumps may be added to the contact pads to facilitate connections to printed circuit boards or other packages. A packaging structure is also added to provide protection and/or facilitate easier handling of the semiconductor device. Such a packaging structure can include an overmold structure formed over the wafer.

FIG. 1 is a schematic illustration of part of a known wafer arrangement in which sixteen semiconductor devices 2 have been formed on a wafer 4 in a 4×4 grid or matrix. Only the outline of the die 6 of each of the semiconductor devices 2 and the contact pads 8 for electrically connecting to the integrated circuit of each die are shown. Other components of the semiconductor devices 2 have been omitted for clarity. Four contact pads 8 per die 6 are shown but it will be appreciated that a different number of contact pads may be present depending on the nature of the integrated circuit to which they connect. The dies 6 are part of a single field area 10 of a reticle that has been projected on to the wafer 4.

Although FIG. 1 shows only sixteen dies 6 within the field area 10, it will be appreciated that the field area 10 may contain hundreds of dies. Between the columns and rows of dies 6 are gaps called scribe lines or saw streets 12 along which the wafer 4 is cut or diced to separate the wafer 4 into individual semiconductor devices 2 such that each semiconductor device has its own die 6 and integrated circuit (not shown). Two saw streets 12 have been highlighted with stippled shading in FIG. 1 but it will be appreciated that a saw street 12 extends between all the columns and rows of the matrix of dies 6 such that each die 6 can be separated.

During the manufacture of integrated circuits, variations in the manufacturing process can result in variations in the electrical characteristics of the circuit. If the variation is outside permitted tolerances it can adversely affect the operation of the integrated circuit and reduce the device yield from the wafer. It is therefore important to test for such variations, for example, by probing the wafer at various points during its manufacture. To avoid testing the actual integrated circuits themselves, which may be damaged by probing, test structures or process control monitoring structures are typically formed on a wafer and are included in the image on the reticle. The test structures include some or all of the processing layers used to form the integrated circuit and can be electrically measured to determine variations in electrical characteristics.

A technique known as trimming can be used to compensate for process variations. After circuit manufacture, various components of the integrated circuit are adjusted, or trimmed, to bring the electrical characteristics within permitted tolerances. For example, trimming can be used to adjust resistances or capacitances, to adjust transconductance values, and to correct for DC offsets resulting from variations in the manufacturing process.

One method of trimming the integrated circuit makes use of fuse circuitry, which is incorporated into the integrated circuit. By probing the test structures during wafer testing, the need for trimming can be identified. Selected fuses are then blown to make the necessary adjustments to the integrated circuit.

Fuse circuits used for device trimming may require dedicated fuse probe pads which are electrically connected to the fuse circuitry. Further pads may also be required to power and control the fuse circuitry. A probe can be applied to a probe pad and an electrical current supplied in order to blow a selected fuse. Probes for testing the wafer are usually provided as part of a probe card having an area covering the area of the wafer to be tested or trimmed and generally cover one or more dies. The probes are provided at locations on the probe card corresponding to the locations of probe pads on the wafer so that when the probe card is used to test the wafer the probes are aligned with the probe pads.

Conventionally, probe pads were provided within the area of each die. However, due to advances in the semiconductor industry, the size of integrated circuits has decreased significantly, and dies have become so small that there is no longer space to accommodate probe pads for testing and trimming the integrated circuits. As can be seen from FIG. 1, there are no probe pads provided within the area of the dies 6 because the dies are two small to accommodate them. Given that the probe pads are only used during testing and trimming, any area of a die provided to accommodate probe pads would be redundant once the testing and trimming procedure is complete and would increase the size of dies for no further benefit.

Some solutions have been proposed which use laser trimming capabilities for trimming semiconductor devices.

However, these are costly in terms of die area and test time. Consequently, trimming is often not performed, which means that semiconductor devices may have integrated circuits with electrical characteristics that do not fall within permitted tolerances. Such devices are rejected at the final quality control test stage, which reduces device yield.

Test structures or process control monitoring structures for wafer testing also need to be accommodated on the wafer and these features are typically included in the scribe lines or saw streets between individual die. However, due to the drive to increase the device yield from a single wafer, there has been an increase in the number of dies on the wafer. This has been achieved through smaller die sizes but also through a reduction in the width of the saw streets between adjacent dies. Consequently, test structures or process control monitoring structures are typically too large to fit within the saw streets.

A previously proposed solution to address the issue of test structures being too large to fit within the saw streets was to take one die within a group of dies on a wafer, for example, within a reticle field area, and use it as a dedicated test die by placing all the test structures within this one die. Such a test die may be referred to as a steal primary die.

FIGS. 2A and 2B are schematic illustrations of parts of two known wafer arrangements in which reticle field areas each utilize a steal primary die for wafer testing and trimming. The wafer arrangement of FIG. 2A is similar to that of FIG. 1 and has a reticle field area 10 comprising sixteen dies 6 arranged in a 4×4 matrix. A single die 6*a* in the top left-hand corner of the field area 10 has been utilized as a steal primary die, into which test structures 14 have been placed. The steal primary die 6*a* includes the test structures or process control monitor structures for testing that the wafer has been manufactured in accordance with the required specification.

FIG. 2B shows a reticle field area 10 of a wafer 4 having a similar construction to that of FIG. 2A with the exception that the reticle field area 10 comprises multiple steal primary dies 6*a*, 6*b* to accommodate all test structures or process control monitor structures required. As can be seen in FIG. 2B, two dies 6*a* and 6*b* in the top left-hand corner of the field area 10 have been utilized as steal primary dies, into which test structures 14 have been placed.

A disadvantage of using a steal primary die to enable trimming, as in the arrangements of FIGS. 2A and 2B, is that there is a reduction in device yield due to the steal primary dies 6*a*, 6*b* occupying wafer area which could otherwise be used for an operational die. Another disadvantage is that the steal primary die 6*a* is required to enable all of the dies 6 to be tested on the reticle. Alternatively, a smaller probe card can be used covering just a subset of the dies 6 within a reticle field area but this requires the reticle field area to have multiple steal primary dies, i.e. one for each area covered by the probe card.

SUMMARY

According to one embodiment, there is provided a semiconductor wafer comprising a first die including a first integrated circuit having a trimmable or programmable component. The trimmable or programmable component is configured to be trimmed or permanently altered in response to an electrical signal. The semiconductor wafer comprises at least one probe pad electrically connected to the trimmable or programmable component. The at least one probe pad is arranged outside of the first die.

According to another embodiment, there is provided a semiconductor wafer comprising a first die including a first integrated circuit having a trimmable or programmable component. The trimmable or programmable component is configured to be trimmed or permanently altered in response to an electrical signal. The semiconductor wafer comprises a second die arranged adjacent to the first die. The second die includes a second integrated circuit and at least one contact pad arranged to allow an electrical connection to be made to the second integrated circuit. The at least one contact pad is additionally electrically connected to the at least one trimmable or programmable component of the first die such that the at least one contact pad of the second die is configured to act as a probe pad.

In one example, the first die may be the device under test.

In one example, the trimmable or programmable component may be a fuse or a one-time programmable device.

In one example, the trimmable component may be a device that changes its properties in a continuous fashion depending on the electrical or thermal conditions applied to it during trimming.

In one example, the trimmable or programmable component may be a memory.

In one example, the at least one contact pad of the second die may be electrically connected to the trimmable or programmable component of the first die by a conductor extending from the at least one contact pad to the trimmable or programmable component.

In one example, the at least one contact pad of the second die may be directly electrically connected to the trimmable or programmable component of the first die by the conductor.

A direct connection between the trimmable or programmable component of the first die and the at least one contact pad of the second die is not required. In one example, the at least one contact pad of the second die may be electrically connected to the trimmable component of the first die via trimming control circuitry configured to control the trimming of the trimmable component. The trimmable or programmable component may be powered by the regular contact pads of the die.

In one example, the trimming control circuitry may include a sensing circuit configured to detect whether a fuse has been blown.

In one example, the first and second dies may be separated by a saw street. The trimming control circuitry may be located in the saw street.

In one example, the first integrated circuit may further include a plurality of trimmable or programmable components. The second die may further include a plurality of contacts pads. Each contact pad of the second die may be electrically connected to a respective trimmable or programmable component of the first die such that each contact pad of the second die is configured to act as a probe pad for its respective trimmable component.

In one example, the first and second dies may have a rectangular shape. A long side of the second die may be arranged adjacent and parallel to a long edge of the first die. At least one contact pad arranged parallel to a long edge of the second die may be used to electrically connect to the at least one trimmable or programmable component of the first die.

In one example, the semiconductor wafer may comprise a plurality of dies arranged in a matrix or grid. The plurality of dies may have a rectangular shape each comprising a trimmable or programmable component. Contact pads arranged adjacent to the long sides of the plurality of dies may be electrically connected to a trimmable or programmable component in adjacent dies.

In one example, the semiconductor wafer may further comprise a third die arranged adjacent to the first die on an opposing side of the first die to the second die. The third die may include a third integrated circuit and at least one contact pad arranged to allow an electrical connection to be made to the third integrated circuit. The at least one contact pad of the third die may be additionally electrically connected to the at least one trimmable or programmable component of the first die such that the at least one contact pad of either the second die or the third die can be configured to act as the at least one probe pad.

In one example, the first die may further comprise a supply voltage contact pad for providing a supply voltage to the first integrated circuit. The first die may further comprise a ground contact pad for providing an electrical ground for the first integrated circuit.

In one example, the first die may further comprise a control contact pad for providing at least one control signal to the first integrated circuit.

In one example, the semiconductor wafer may include a first plurality of dies arranged in a first reticle field area and a second plurality of dies arranged in a second reticle field area. The first reticle field area may be electrically connected to the second reticle field area by a conductive section.

In one example, the conductive section may be arranged in a saw street between adjacent dies.

In one example, the conductive section may include a metal or metal alloy.

In one example, each die in each of the first and second reticle field areas may be connected to an adjacent die by a conductive section.

In one example, the semiconductor wafer may include a plurality of dies configured to be tested in pairs. Each pair of dies may include a first paired die and a second paired die. The first paired die may be configured to be tested from the second paired die. The second paired die may be configured to be tested from the first pair die.

According to another embodiment, there is provided a method of testing or trimming or programming a semiconductor wafer having a first die including a first integrated circuit having a trimmable or programmable component. The method includes making an electrical connection to at least one probe pad arranged on the wafer. The at least one probe pad is electrically connected to the trimmable or programmable component and is arranged outside of the first die. The method includes applying an electrical signal to the at least one probe pad to trim or permanently alter an electrical characteristic of the trimmable or programmable component.

In one example, the method may include a step of determining an electrical characteristic of the trimmable component prior to the step of applying an electrical signal to the at least one probe pad to trim the trimmable the component.

According to another embodiment, there is provided a method of testing or trimming or programming a semiconductor wafer comprising a first die including a first integrated circuit having a trimmable or programmable component. The method includes making an electrical connection to at least one probe pad. The at least one probe pad comprises a contact pad of a second die arranged adjacent to the first die. The contact pad of the second die is electrically connected to the trimmable or programmable component of the first die. The method includes applying an electrical signal to the contact pad of the second die to trim or permanently alter an electrical characteristic of the trimmable or programmable component.

In one example, the method may include a step of determining an electrical characteristic of the trimmable component prior to the step of applying an electrical signal to the at least one probe pad to trim the trimmable the component.

In one example, making an electrical connection to the at least one probe pad may include making an electrical connection to a contact pad of either a second die or a third die arranged adjacent to the first die and on opposing sides of the first die. The contact pad of the second die and third die may be configured to act as the at least one probe pad and may be electrically connected to the trimmable or programmable component of the first die.

According to another embodiment, there is provided a probe card for testing or trimming or programming a semiconductor wafer having a first die including a first integrated circuit having a trimmable or programmable component. The probe card comprises at least one probe arranged to make electrical contact with at least one probe pad arranged on the wafer. The at least one probe pad is electrically connected to the trimmable or programmable component and is arranged outside of the first die.

According to another embodiment, there is provided a probe card for testing or trimming or programming a semiconductor wafer having a first die including a first integrated circuit having a trimmable or programmable component. The probe card comprises at least one probe arranged to make electrical contact with a contact pad of a second die arranged adjacent to the first die. The contact pad of the second die is configured to act as a probe pad and is electrically connected to the trimmable or programmable component of the first die.

In one example, the at least one probe pin may be arranged to make electrical contact with a contact pad of either a second die or a third die arranged adjacent to the first die and on opposing sides of the first die. The contact pad of each of the second die and third die may be configured to act as a probe pad and may be electrically connected to the trimmable or programmable component of the first die.

Still other aspects, embodiments, and advantages of these exemplary aspects and embodiments are discussed in detail below. Embodiments disclosed herein may be combined with other embodiments in any manner consistent with at least one of the principles disclosed herein, and references to “an embodiment,” “some embodiments,” “an alternate embodiment,” “various embodiments,” “one embodiment” or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to a semiconductor wafer comprising a first die including a first integrated circuit having a trimmable or programmable component and at least one probe pad electrically connected to the trimmable or programmable component. Advantageously, the at least one probe pad is arranged outside of the first die so there is no need to increase die size to accommodate probe pads and small die size can be maintained. Furthermore, the trimmable component allows integrated circuits on the dies of the wafer to be trimmed, which increases the yield, quality and reliability of the semiconductor devices into which the integrated circuits are incorporated.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of “including,” “comprising,” “having,” “containing,” “involving,” and variations thereof is meant to encompass the items listed thereafter and equivalents thereof as well as additional items. References to “or” may be construed as inclusive so that any terms described using “or” may indicate any of a single, more than one, and all of the described terms.

Figure 1:
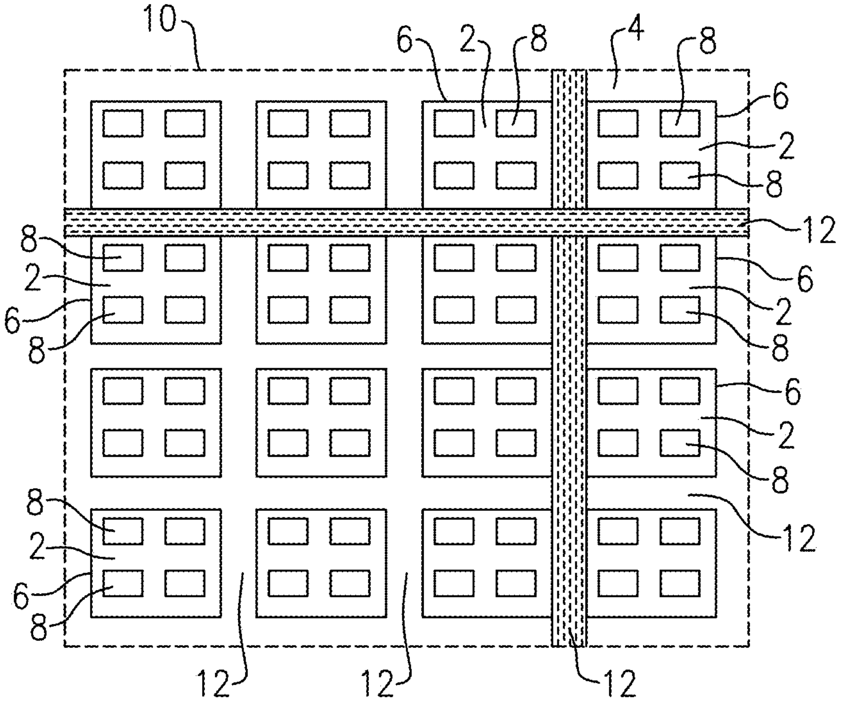
FIG. 1 is a schematic illustration of part of a known wafer arrangement including a reticle field area having a matrix of semiconductor devices.
Figure 2A:
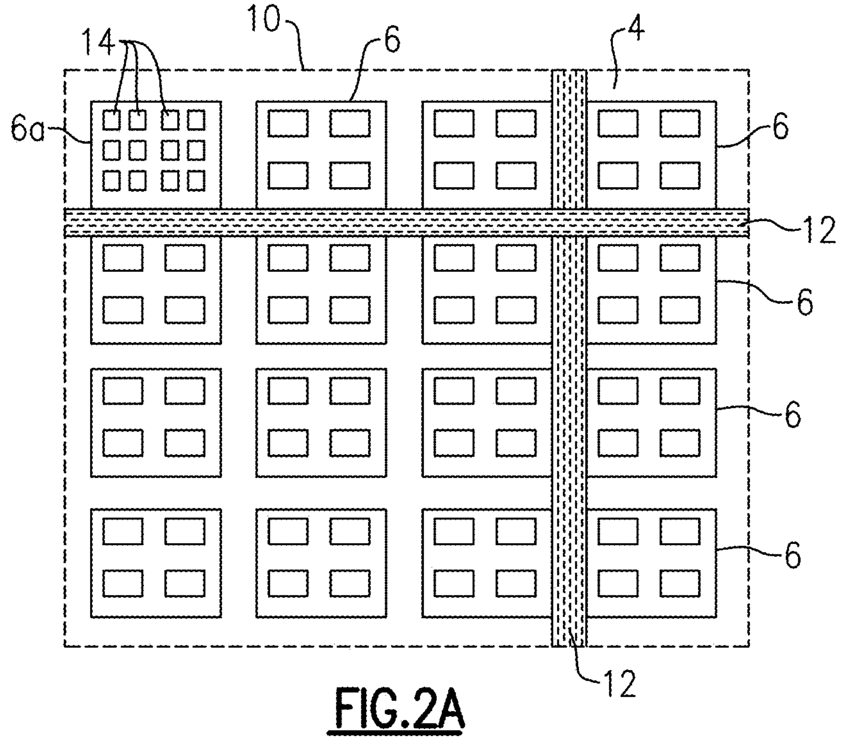
FIGS. 2A and 2B are schematic illustrations of parts of two known wafer arrangements in which reticle field areas each utilize a steal primary die for wafer testing and trimming.
Figure 2B:
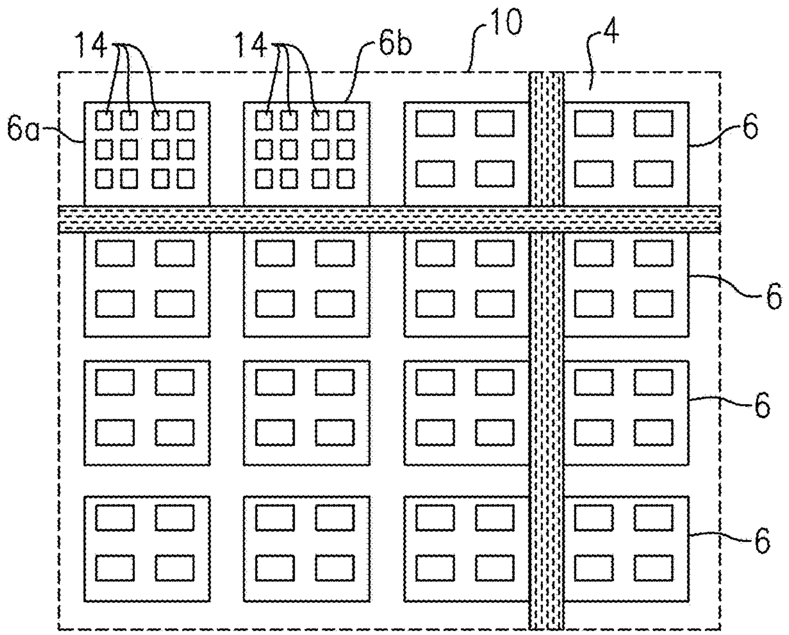
Figure 3:
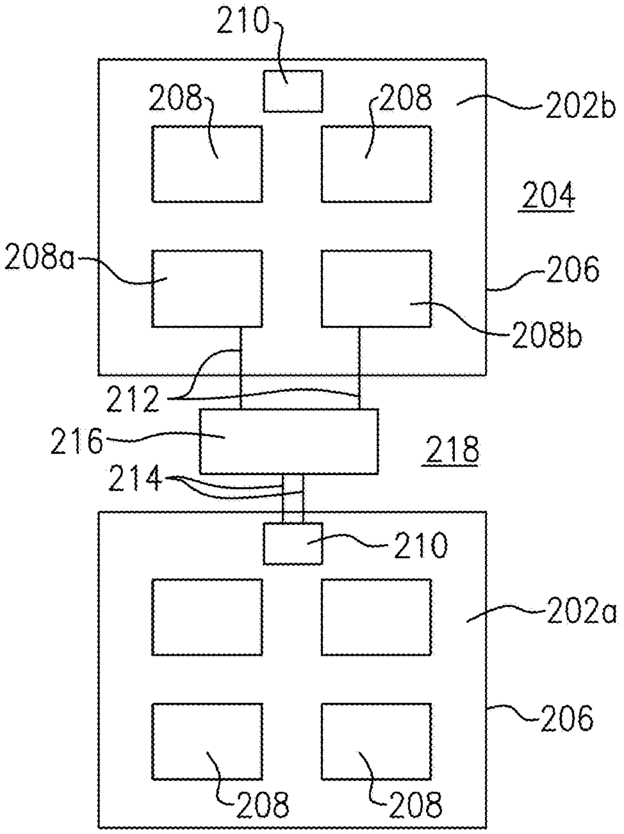
FIG. 3 is a schematic illustration of two semiconductor devices on a semiconductor wafer according to an embodiment, in which one die is being tested or trimmed by using contact pads in an adjacent die.

FIG. 3 is a schematic illustration of two semiconductor devices 202*a* and 202*b* on a semiconductor wafer 204 according to an embodiment. In the embodiment of FIG. 3, a first or lower semiconductor device 202*a* is being tested or trimmed or programmed by using contact pads in an adjacent second or upper semiconductor device 202*b*. In other words, the first or lower semiconductor device 202*a* is the device under test. Although only two semiconductor devices are shown in FIG. 3, it will be appreciated that this arrangement could be used to test or trim multiple semiconductor devices by using an adjacent die or several adjacent dies to test or trim a particular device. Each semiconductor device 202*a*, 202*b* comprises a die 206 having an integrated circuit (not shown) thereon and contact pads 208 for electrically connecting to their respective integrated circuit. Some components of the semiconductor devices 202*a* and 202*b* have been omitted for clarity. Each semiconductor device 202*a* and 202*b* also comprises fuse circuitry including a fuse block 210 having a plurality of fuses (not shown) or other programming or programmable devices. Each of the fuses in fuse block 210 is a trimmable component.

In addition to being electrically connected to their respective integrated circuit (not shown), the lower two contact pads 208*a* and 208*b* of semiconductor device 202*b* are also electrically connected to the fuse block 210 of the first semiconductor device 202*a* by means of conductors 212 and 214. Conductors 212 and 214 are dedicated to providing an interconnect between contact pads 208*a*, 208*b* and fuse block 210 and are only used at wafer testing and trimming. In the embodiment of FIG. 3, contact pads 208*a* and 208*b* are connected to fuse block 210 via a control block 216 located in saw street 218. However, it will be appreciated that contact pads 208*a* and 208*b* could be directly connected to fuse block 210 without any intervening control circuitry. The control block 216 is configured to control the fuse block 210 and may include one or more of multiplexing circuitry or voltage regulation circuitry. Such circuitry is only needed at when semiconductor device 202*a* is being tested or trimmed and is not needed on the die 206 in the final assembled product. In the embodiment of FIG. 3, the saw street 218 is too narrow to accommodate a probe pad. However, control circuitry is generally smaller than probe pads and there is sufficient to accommodate circuitry in the saw street 218. It will therefore be appreciated that additional circuitry, which is not required in the final assembled device, can also be located in saw street 218. To activate or blow the fuses in the fuse block 210 of semiconductor device 202*a*, an electrical signal can be applied via probes connected to contact pads 208*a* and 208*b* in adjacent semiconductor device 202*b*. Therefore, the contact pads 208*a* and 208*b* of semiconductor device 202*b* act as probe pads connecting to fuse block 210 of semiconductor device 202*a*.

During testing and trimming, in addition to applying probes to contact pads 208*a* and 208*b* of semiconductor device 202*b*, probes are also applied to the contact pads 208 of semiconductor device 202*a* to, for example, provide a supply voltage and ground voltage to power semiconductor device 202*a*, which is the device under test, and to provide various control signals to control the integrated circuit (not shown) of semiconductor device 202*a*. When the wafer 204 is diced, the portions of conductors 212, 214 and control block 216 in saw street 218 are removed by the cutting action. Control block 216 can be located on the wafer 204 such as to be fully removed during the dicing process or can be designed so that it does not alter operation of the semiconductor devices 202*a* and 202*b* after dicing.

Figure 4A:
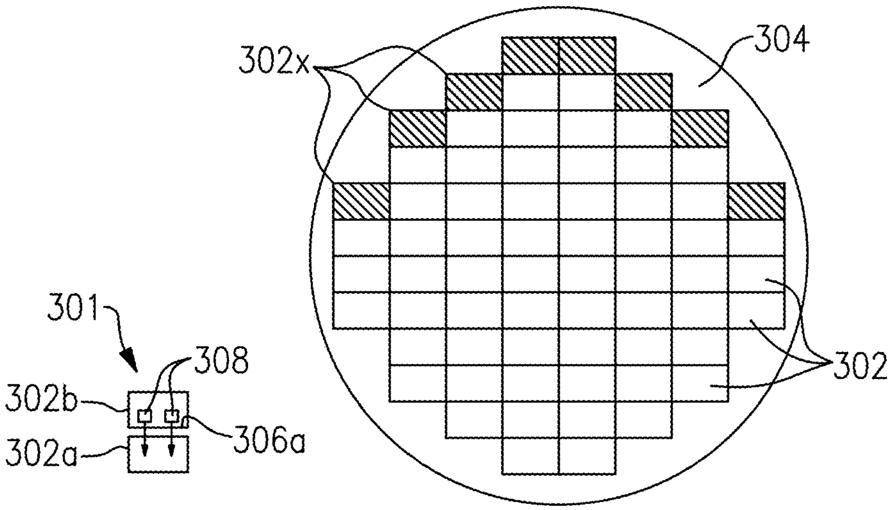
FIGS. 4A and 4B are schematic illustrations of two different arrangements for testing or trimming a die using the contact pads of an adjacent die and the impact on device yield of the wafer of each arrangement.
Figure 4B:
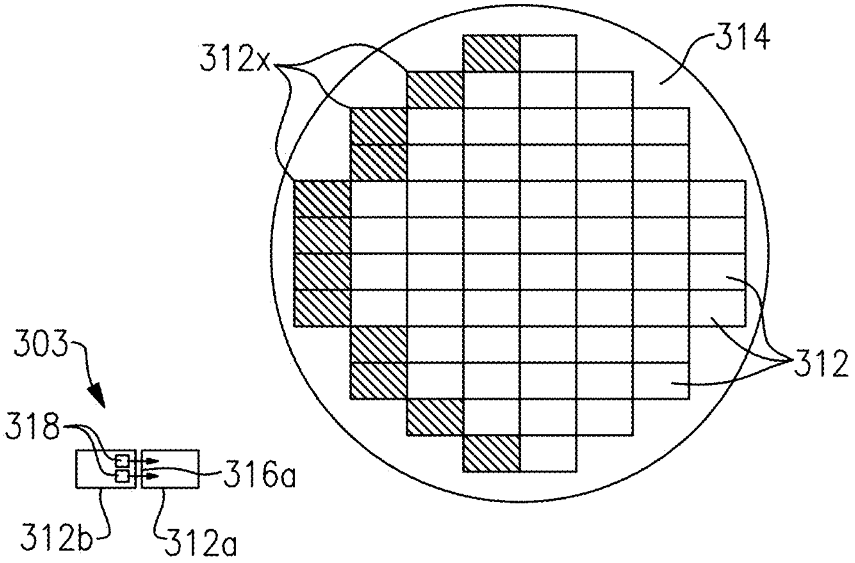

FIGS. 4A and 4B are schematic illustrations of two different arrangements for testing or trimming a die using the contact pads of an adjacent die and the impact on device yield of the wafer of each arrangement. FIG. 4A shows a first arrangement 301 for testing or trimming a die arranged on wafer 304. The arrangement of FIG. 4A is identical to that shown in FIG. 3. A first or lower semiconductor device 302*a* is being tested or trimmed by using the contact pads 308 of an adjacent second or upper semiconductor device 302*b*. The first or lower semiconductor device 302*a* is the device under test. Semiconductor devices 302*a* and 302*b* are rectangular and contact pads 308 arranged along a long side 306 of the rectangular die are being used to test.

Wafer 304 of FIG. 4A comprises a plurality of semiconductor devices 302 having the configuration shown in arrangement 301. It will be appreciated that each of semiconductor devices 302 has a die (not shown) which needs to be tested. All of the semiconductor devices 302 on wafer 304 which have a semiconductor device above them can be tested using arrangement 301. Due to the configuration of arrangement 301, the uppermost semiconductor device 302*x* in each column of semiconductor devices cannot be tested because it does not have a device from where contacts pads can be accessed to test or trim. In the embodiment of FIG. 4A, eight semiconductor devices 302*x* out of the total number of semiconductor devices 302 cannot be tested.

FIG. 4B shows a second arrangement 303 for testing or trimming a die arranged on wafer 314. The principle of testing and trimming in the arrangement of FIG. 4B is similar to that in FIG. 3. However, in the arrangement of FIG. 4B, a first semiconductor device 312*a* is being tested or trimmed by using the contact pads 318 connected to a fuse block (not shown) of an adjacent second semiconductor device 312*b*, which is arranged laterally to the left of the first semiconductor device 312*a* and not above the first semiconductor device 312*a*. The first or right-hand semiconductor device 312*a* is the device under test. Semiconductor devices 312*a* and 312*b* are rectangular and contact pads 318 arranged along a short side 316*a* of the rectangular die are being used to test.

Wafer 314 of FIG. 4B comprises a plurality of semiconductor devices 312 having the configuration shown in arrangement 303. It will be appreciated that each of semiconductor devices 312 has a die (not shown) which needs to be tested. All of the semiconductor devices 312 on wafer 314 which have a semiconductor device laterally to the left of them can be tested using arrangement 303. Due to the configuration of arrangement 303, the leftmost semiconductor device 302*x* in each row of semiconductor devices 312 cannot be tested because it does not have a device from where contacts pads can be accessed to test or trim. In the embodiment of FIG. 4B, twelve semiconductor devices 302*x* out of the total number of semiconductor devices 302 cannot be tested.

It is clear that the arrangement 301 of FIG. 4A results in fewer devices not being tested and therefore the device yield from the wafer 304 of FIG. 4A will likely be higher than from the wafer 314 of FIG. 4B. It will be appreciated that FIGS. 4A and 4B are schematic and not to scale and, in reality, the number of dies on the wafers 304 and 314 would be higher and the number of dies which consequently cannot be tested would be higher. It will also be appreciated that the improvement in device yield resulting from arrangement 301 of FIG. 4A is dependent on the aspect ratio of the semiconductor devices or dies and the location of the contact pads for testing should be decided based on the particular aspect ratio of the semiconductor devices on the wafer and the wafer map. However, it is common for dies and their associated semiconductor devices to have a rectangular aspect ratio and therefore the benefits of the arrangement 301 of FIG. 4A would generally be realized.

Figure 5:
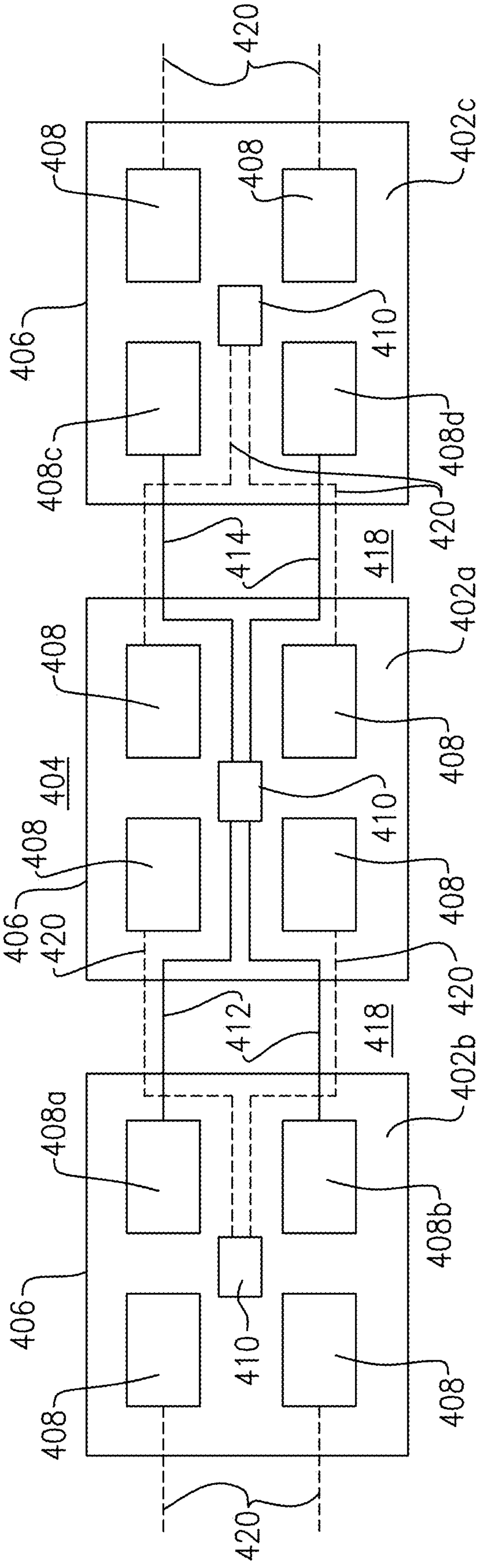
FIG. 5 is a schematic illustration of three semiconductor devices on a semiconductor wafer according to an embodiment, in which the middle die can be tested or trimmed by using contact pads in an adjacent die located on either side of the device under test.

FIG. 5 is a schematic illustration of three semiconductor devices 402*a* to 402*c* on a semiconductor wafer 404 according to an embodiment, in which a first or middle semiconductor device 402*a* can be tested or trimmed by using contact pads located in adjacent semiconductor devices 402*b*, 402*c* located on either side of the first semiconductor device 402*a*. In other words, the first or middle semiconductor device 402*a* is the device under test. Each of semiconductor devices 402*a* to 402*c* comprises a die 406 having an integrated circuit (not shown) thereon and contact pads 408 for electrically connecting to their respective integrated circuit. Some components of the semiconductor devices 202*a* and 202*b* have been omitted for clarity. Each of semiconductor devices 402*a* to 402*c* also comprises fuse circuitry including a fuse block 410 having a plurality of fuses (not shown). Each of the fuses in fuse block 410 is a trimmable component.

The two right-hand contact pads 408*a* and 408*b* of the second or left-hand semiconductor device 402*b* are electrically connected to the fuse block 410 of the first or middle semiconductor device 402*a* by means of conductors 412, in addition to being electrically connected to the integrated circuit (not shown) of semiconductor device 402*b*. The two left-hand contact pads 408*c* and 408*d* of the third or right-hand semiconductor device 402*c* are electrically connected to the fuse block 410 of the first or middle semiconductor device 402*a* by means of conductors 414, in addition to being electrically connected to the integrated circuit (not shown) of semiconductor device 402*c*. Conductors 212 and 214 are dedicated to providing an interconnect between contact pads 408*a* to 408*d* and the fuse block 210 of first semiconductor device 402 and are only used at wafer testing and trimming. In the embodiment of FIG. 5, contact pads 408*a* to 408*d* are directly connected to fuse block 410 of the first semiconductor device 402*a*. However, it will be appreciated that contact pads 408*a* to 408*d* could be connected to fuse block 410 of the first semiconductor device 402*a* via control circuitry (not shown), which may be located in saw streets 418.

To activate or blow the fuses in the fuse block 410 of semiconductor device 402*a*, an electrical signal can be applied via probes connected to contact pads 408*a* and 408*b* of adjacent semiconductor device 402*b* or contact pads 408*c* and 408*d* of adjacent semiconductor device 402*c*. Therefore, the contact pads 408*a* to 408*d* of semiconductor devices 402*b* and 402*c* act as probe pads for connecting to fuse block 410 of semiconductor device 402*a*.

During testing and trimming of semiconductor device 402*a* of FIG. 5, in addition to applying probes to contact pads 408*a* and 408*b* of semiconductor device 402*b* or contact pads 408*c* and 408*d* of semiconductor device 402*c*, probes are also applied to the contact pads 408 of semiconductor device 402*a* to, for example, provide a supply voltage and ground voltage to power semiconductor device 402*a*, which is the device under test, and to provide various control signals to control the integrated circuit (not shown) of semiconductor device 402*a*. When the wafer 404 is diced, the portions of conductors 412, 414 in saw streets 218 are removed by the cutting action.

Although only three semiconductor devices are shown in FIG. 5, it will be appreciated that this arrangement could be used to test or trim a larger number of semiconductor devices. Furthermore, the embodiment of FIG. 5 allows all the semiconductor devices on a wafer to be tested or trimmed by allowing adjacent semiconductor devices on either side of the semiconductor device under test to be used. To achieve this, additional conductors 420 (denoted by dashed lines) are provided which interconnect contact pads 408 of one semiconductor device to the fuse block 410 of an adjacent semiconductor device. In this way, a probe card can be stepped across the wafer 404 to sequentially test all the semiconductor devices on the wafer 404. For example, in FIG. 5, once the first semiconductor device 402*a* has been tested, the contact pads 408 of the first semiconductor device 402*a* or the contact pads of a further semiconductor device (not shown) to the right of the third semiconductor device 402*c* could be used as probe pads to test or trim the fuse block 410 in third semiconductor device 402*c*. Alternatively, the contact pads 408 of the first semiconductor device 402*a* or the contact pads of a further semiconductor device (not shown) to the left of the second semiconductor device 402*b* could be used as probe pads to test or trim the fuse block 410 in second semiconductor device 402*b*.

By allowing a semiconductor device to be tested or trimmed using contact pads of an adjacent semiconductor device located on either side of the device under test, the embodiment of FIG. 5 represents an improvement over the embodiment of FIG. 3 which permits testing from only one side. In particular, the embodiment of FIG. 5 overcomes the issue shown in FIGS. 4A and 4B in which some semiconductor devices on the edge of the wafer could not be tested. In the embodiment of FIG. 5, semiconductor devices on the edge of the wafer can be tested by using the contact pads of the adjacent semiconductor device on the opposite side of the device under test to the edge of the wafer. Although FIG. 5 shows semiconductor devices 402*a* to 402*c* arranged in a row, it will be appreciated that the semiconductor devices 402*a* to 402*c* could also be arranged in a column.

Figure 6A:
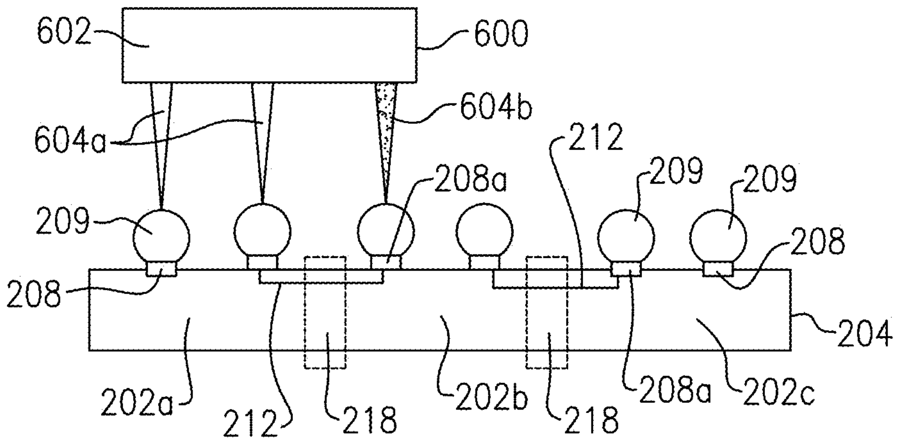
FIG. 6A is a schematic illustration of a probe card for testing a semiconductor wafer according to another embodiment.

FIG. 6A is a schematic illustration of a probe card 600 for testing a semiconductor wafer 204 according to an embodiment in which a semiconductor device 202*a* is tested and trimmed by using contact pads 208 located in an adjacent semiconductor device 202*b*, for example, the semiconductor wafer 204 of FIG. 3. The wafer 204 is shown comprising three semiconductor devices 202*a* to 202*c*, although it will be appreciated that, in reality, the wafer will comprise many more semiconductor devices. Each of semiconductor devices 202*a* to 202*c* can be a wafer-level chip scale package (WLCSP) and has contact pads 208 for electrically connecting to its integrated circuit arranged on the die (not shown). Solder bumps 209 have been added to the contact pads 208 to facilitate connecting the semiconductor devices 202*a* to 202*c* to printed circuit boards or other packages. In addition to being connected to their respective integrated circuits, contact pads 208*a* of semiconductor devices 202*b* and 202*c* are each connected to a trimmable component (not shown) on semiconductor devices 202*a* and 202*b* respectively by means of conductors 212. The conductors can either be incorporated as part of the metal layer on the dies of the semiconductor devices 202*a* to 202*c* or can be incorporated as part of a redistribution layer of each of the semiconductor devices 202*a* to 202*c*.

The probe card 600 comprises a support 602 which carries a plurality of probes 604*a* and 604*b*. Probes 604*a* and 604*b* are arranged to make contact with the solder bumps 209 arranged on the contact pads 208. Given that probe pads in the saw streets 218 are not being used in the embodiment of FIG. 6A, the probes 604*a* and 604*b* can all be the same length. Probes 604*a* may be used to provide a supply voltage or a control signal to semiconductor device 202*a*, which is the device under test, whilst probe 604*b* used to perform a test of a trimmable component (not shown) of the integrated circuit on semiconductor device 202*a* and trim the trimmable component as required. Once semiconductor device 202*a* has been tested and trimmed, the probe card 600 can be stepped across to test the next device, i.e. semiconductor device 102*b*. The interconnection between semiconductor devices provided by conductors 212 is severed once the wafer 204 is diced along saw streets 218.

Figure 6B:
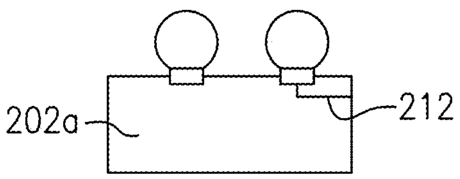
FIG. 6B is schematic side view of a semiconductor device once it has been separated from the semiconductor wafer of FIG. 6A.

FIG. 6B is schematic side view of semiconductor device 202*a* of FIG. 6A once it has been separated from the semiconductor wafer 204 of FIG. 6A by dicing. A portion of conductor 212 remains after dicing. However, since conductor 212 will not be in contact with any other component or device, this does not adversely affect performance.

Figure 7A:
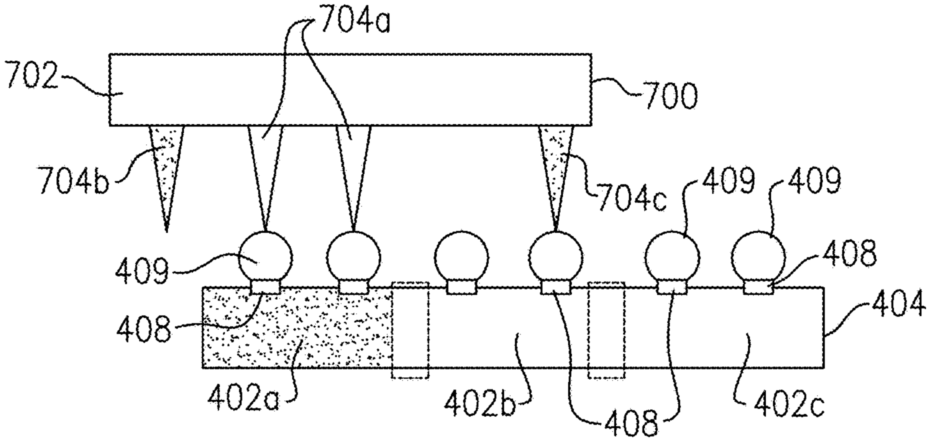
FIGS. 7A, 7B, and 7C are schematic illustrations of a probe card for testing a semiconductor wafer according to another embodiment, in which three semiconductor devices are being sequentially tested or trimmed.
Figure 7B:
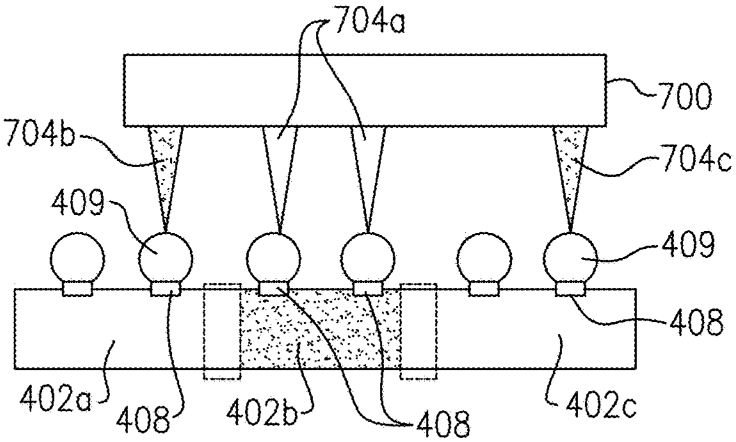
Figure 7C:
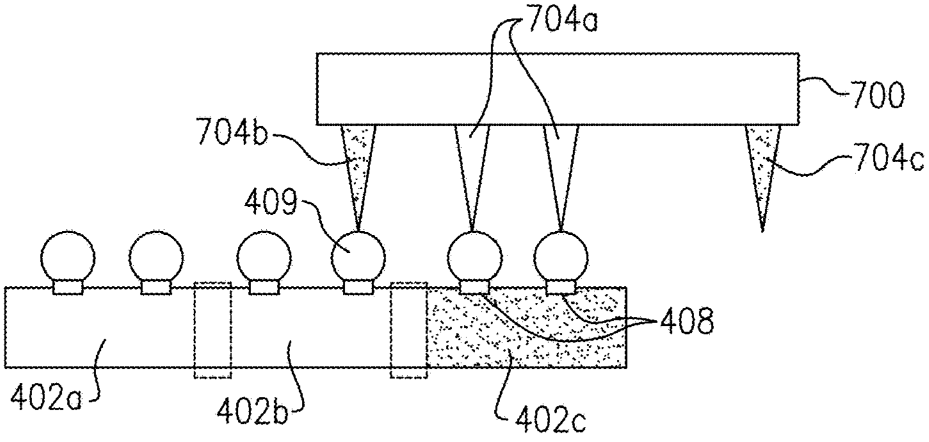

FIGS. 7A to 7C are schematic illustrations of a probe card 700 for testing a semiconductor wafer according to another embodiment in which a semiconductor device can be tested and trimmed by using contact pads 208 located in adjacent semiconductor devices on either side of the device under test, for example, the semiconductor wafer 404 of FIG. 5. In FIGS. 7A to 7C, three semiconductor devices are shown being sequentially tested or trimmed.

Referring to FIG. 7A, the wafer 404 is shown comprising three semiconductor devices 402*a* to 402*c*, although it will be appreciated that, in reality, the wafer will comprise many more semiconductor devices. Each of semiconductor devices 402*a* to 402*c* is a wafer-level chip scale package (WLCSP) and has contact pads 408 for electrically connecting to its integrated circuit arranged on the die (not shown). Solder bumps 409 have been added to the contact pads 408 to facilitate connecting the semiconductor devices 402*a* to 402*c* to printed circuit boards or other packages. In addition to being connected to their respective integrated circuits, the contact pads 408*a* of each of semiconductor devices 402*b* and 402*c* are connected to a trimmable component (not shown) located in an adjacent semiconductor device by means of conductors (not shown).

The probe card 700 of FIGS. 7A to 7C is configured to a test and trim a semiconductor device using contact pads 208 located in adjacent semiconductor devices on either side of the device under test. The probe card 700 comprises a support 702 which carries a plurality of probes 704*a* to 704*c*. Probes 704*a* to 704*c* are arranged to make contact with the solder bumps 409 arranged on the contact pads 408 and are all the same length. Probes 704*a* may be used to provide a supply voltage or a control signal to semiconductor device under test, whilst probes 704*b* and 704*c* may be used to perform a test of a trimmable component (not shown) of the integrated circuit of the device under test and trim the trimmable component as required. An advantage of probe card 700 is that it only needs to cover three dies on wafer 404 instead of an entire reticle field area, which allows the use of smaller probe cards.

In FIG. 7A, the probe card 700 is arranged over semiconductor device 402*a* (shaded grey), which is the device under test. Probes 704*a* are being used to provide a supply voltage and a control signal to semiconductor device 402*a*, whilst probe 704*c* is being used to test and trim a trimmable component (not shown) on semiconductor device 402*a* via a contact pad 408 located on semiconductor device 402*b*. Semiconductor device 402*a* may be located at an edge of the wafer 404, in which case probe pad 704*b* would not be in contact with a solder bump and would not be used for testing and trimming. Alternatively, there may be an additional semiconductor device (not shown) located to the left of semiconductor device 402*a*, in which case semiconductor device 402*a* could be tested and trimmed using either probe 704*b* or 704*c* or each of these probes could test and trim a different trimmable component in semiconductor device 402*a*.

In FIG. 7B, the probe card 700 has been stepped across and is arranged over semiconductor device 402*b* (shaded grey), which is the device under test. Probes 704*a* are being used to provide a supply voltage and a control signal to semiconductor device 402*b*. Probes 704*b* and 704*c* are in contact with a solder bump in each of semiconductor devices 402*a* and 402*c*. Therefore, a trimmable component (not shown) in semiconductor device 402*b* could be tested and trimmed using either probe 704*b* or 704*c* or each of these probes could test and trim a different trimmable component in semiconductor device 402*b*.

In FIG. 7C, the probe card 700 has been stepped across again and is arranged over semiconductor device 402*c* (shaded grey), which is the device under test. Probes 704*a* are being used to provide a supply voltage and a control signal to semiconductor device 402*c*, whilst probe 704*b* is being used to test and trim a trimmable component (not shown) on semiconductor device 402*c* via a contact pad 408 located on semiconductor device 402*b*. Semiconductor device 402*c* may be located at an edge of the wafer 404, in which case probe pad 704*c* would not be in contact with a solder bump and would not be used for testing and trimming. Alternatively, there may be an additional semiconductor device (not shown) located to the right of semiconductor device 402*c*, in which case semiconductor device 402*c* could be tested and trimmed using either probe 704*b* or 704*c* or each of these probes could test and trim a different trimmable component in semiconductor device 402*c*. FIGS. 7A to 7C show that probes 704*c* and 704*b* can be used to probe the first and last die of a row of dies on the wafer 404.

FIGS. 6A and 7A to 7C show probe cards 600 and 700 respectively for testing WLCSPs in which the semiconductor devices have been "bumped" by adding solder bumps 209 and 409 respectively. However, it will be appreciated that the probe cards 600 and 700 can also be used to test "unbumped" semiconductor wafers in which the semiconductor devices have not been provided with solder bumps. In this case, the probes 604*a* and 604*b* of probe card 600 will make direct contact with the contact pads 208 of the semiconductor devices 202*a* to 202*c* and the probes 704*a* to 704*c* of probe card 700 will make direct contact with the contact pads 408 of the semiconductor devices 402*a* to 402*c*.

Figure 8:
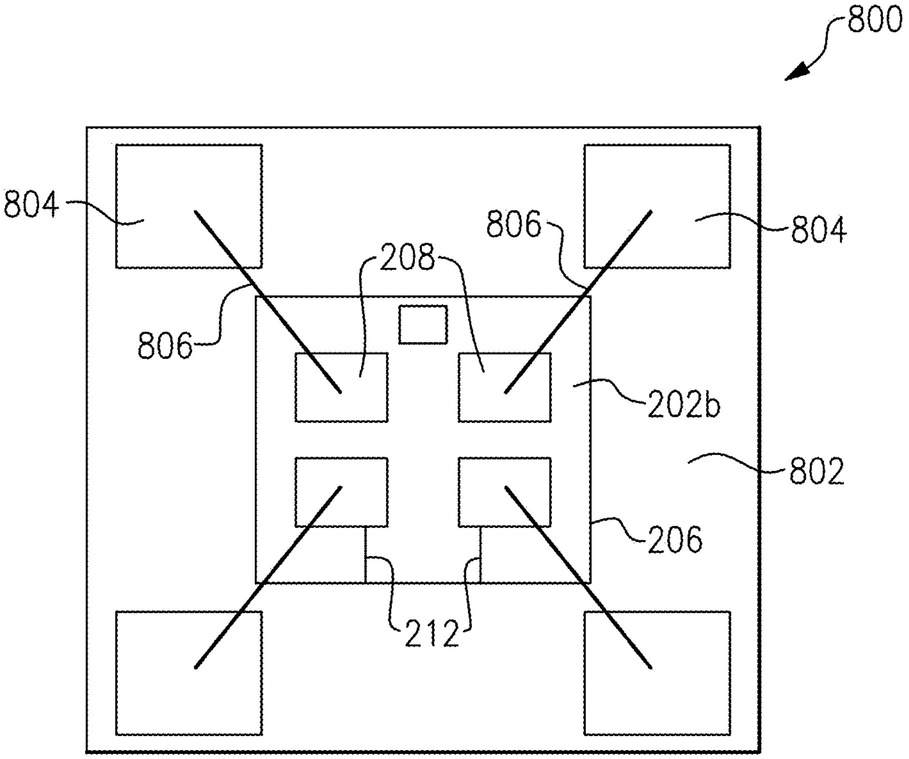
FIG. 8 is a schematic illustration of a multichip module including a semiconductor device that has been separated from a wafer and mounted within the multichip module.

FIG. 8 is a schematic illustration of a multichip module 800 that includes a semiconductor device 202*b* that has been separated from a wafer. The multichip module 800 comprises a substrate 802 upon which the semiconductor device 202*b* is mounted. The semiconductor device 202*b* is the same as the upper semiconductor device 202*b* of FIG. 3. The contact pads 208 of the semiconductor device 202*b* are connected to bonding pads 804 of the multichip module 800 by means of bonding wires 806. It will be appreciated that multichip modules may comprise a plurality of semiconductor devices and integrated circuits, although these are not shown in the multichip module 800 of FIG. 8. Alternatively, the semiconductor device 202*b* can be flip-chipped and mounted on a printed circuit board. As can be seen in FIG. 8, the semiconductor device 202*b* includes the portions of the conductors 212 which are located within the die 206 and which are used to connect to a fuse block (not shown) in an adjacent die (not shown), when die 206 is still part of a wafer. Conductors 212 are severed by the dicing process during which individual semiconductor devices are separated from the wafer. However, the ends of the conducts 212 which extend to the edge of the die 206 will be electrically isolated in the final assembled product, for example, when mounted within the multichip module of FIG. 8, and therefore will not adversely affect the performance of the semiconductor device 202*b*.

Figure 9:
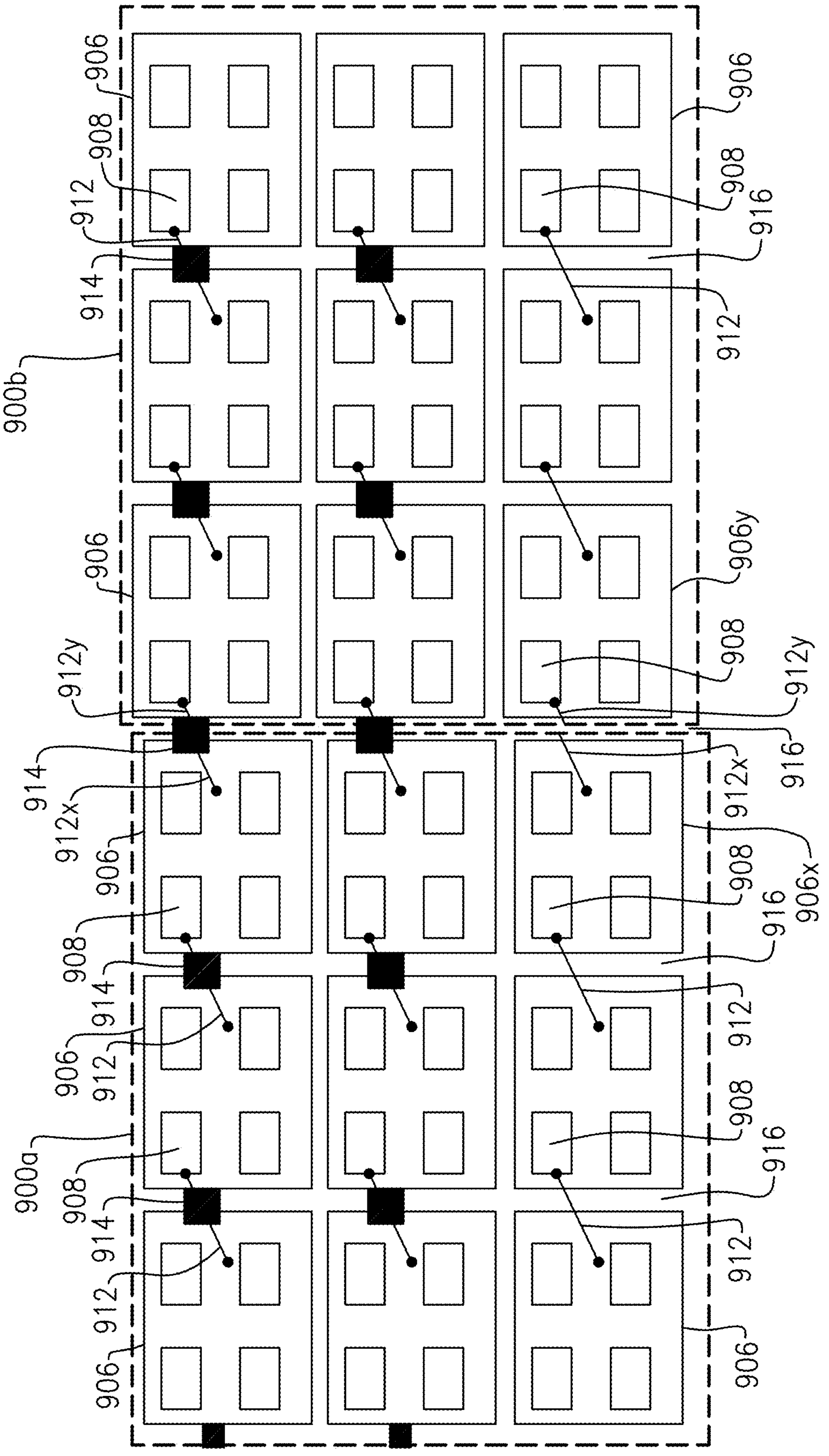
FIG. 9 is a schematic illustration of part of a semiconductor wafer showing two misaligned reticle field areas and the interconnections between the reticle field areas and the dies within the reticle field areas.

FIG. 9 is a schematic illustration of part of a semiconductor wafer showing two misaligned reticle field areas 900*a* and 900*b*. As can be seen in FIG. 9, the reticle field area 900*b* is misaligned with reticle field area 900*a* in both the horizontal and vertical directions. Each of reticle field areas 900*a* and 900*b* comprise a plurality of dies 906. In FIG. 9 each reticle field area 900*a* and 900*b* comprises nine dies 906 arranged in a 3×3 matrix. However, it will be appreciated that in practice each reticle field area 900*a* and 900*b* will comprise many more dies, for example, hundreds of dies. In combination, the dies 906 of reticle field areas 900*a* and 900*b* comprise six columns of dies 906 and three rows of dies 906. A contact pad 908 in each of the dies 906 of the second to further column of dies 906 is connected via a conductor 912 to a fuse block (not shown) in the lefthand adjacent die. The conductors 912 interconnect dies both within each of the reticle filed areas 900*a* and 900*b* and between the reticle filed areas 900*a* and 900*b*, i.e. between the third and fourth column of dies 906.

As can be seen in the bottom row of dies 906 in FIG. 9, due to the misalignment between reticle filed areas 900*a* and 900*b*, the conductor portion 912*x* extending from the bottom right-hand die 906*x* towards reticle field area 900*b* is misaligned with the conductor portion 912*y* extending from the bottom left-hand die 906*y* towards reticle field area 900*a*. Therefore, the conductor portions 912*x* and 912*y* are not connected and the electrical interconnection between the reticle filed areas 900*a* and 900*b* at this point has been broken. However, in the top two rows of dies 906, a conductive section 914 of metal has been placed in the saw streets 916 both between the dies 906 within each of the reticle filed areas 900*a* and 900*b* and in the space or saw street 916 between the reticle filed areas 900*a* and 900*b*. The conductive sections 914 have been placed in the region where the conductors extend. Although the conductor portions 912*x* and 912*y* extending between the reticle field areas 900*a* and 900*b* in the top two rows of dies 906 are misaligned, they overlap with the conductive sections 914 are therefore a connection between the reticle field areas 900*a* and 900*b* is maintained.

Figure 10B:
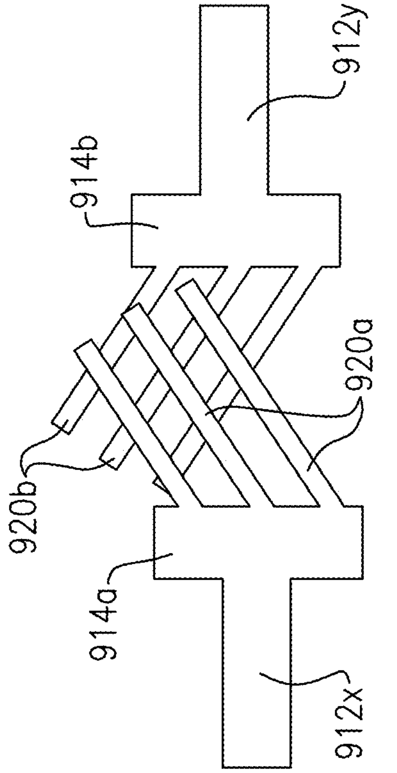
FIGS. 10A and 10B are schematic illustrations showing two different embodiments of conductive sections for connecting reticle field areas.
Figure 10A:
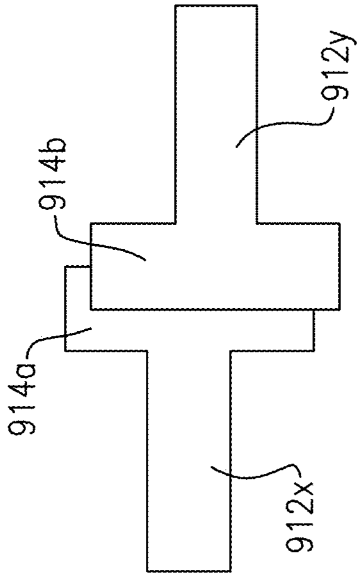

FIGS. 10A and 10B are schematic illustrations showing two different embodiments of conductive sections for connecting reticle field areas. In the embodiment of FIG. 10A, a first conductive section 914*a* is connected to a conductor portion 912*x*, which is connected to a fuse block of a die on a first reticle field area (not shown). A second conductive section 914*b* is connected to a conductor portion 912*y*, which is connected to a contact pad of a die on a second reticle field area (not shown). The conductive sections 914*a* and 914*b* are made from the same metallic material as the conductor portions 912*x* and 912*y* and overlap to provide electrical connection between conductor portions 912*x* and 912*y*. The conductive sections 914*a* and 914*b* are wider than the conductor portions 912*x* and 912*y* and therefore allow for a greater overlap of material. This arrangement can compensate for a greater degree of misalignment between the first and second reticle field areas compared to using conductors alone. Imperfections in the topography arising from the metallic conductive sections 914*a*, 914*b* can be dismissed as these structures will be removed during wafer dicing (die separation).

The embodiment of FIG. 10B is similar to that of FIG. 10A except that each of the conductive sections 914*a* and 914*b* has a plurality (in this example, three) of angled fingers 920*a* extending from an opposite side of the conductive sections 914*a* and 914*b* to that which the conductor portions 912*x* and 912*y* are connected to. In this arrangement, the fingers 920*a* overlap to provide electrical connection between conductor portions 912*x* and 912*y*. This arrangement can compensate for a greater degree of misalignment between the first and second reticle field areas compared to using conductors alone. In particular, this arrangement can compensate for a significant amount of horizontal misalignment as well as vertical misalignment.

Figure 11:
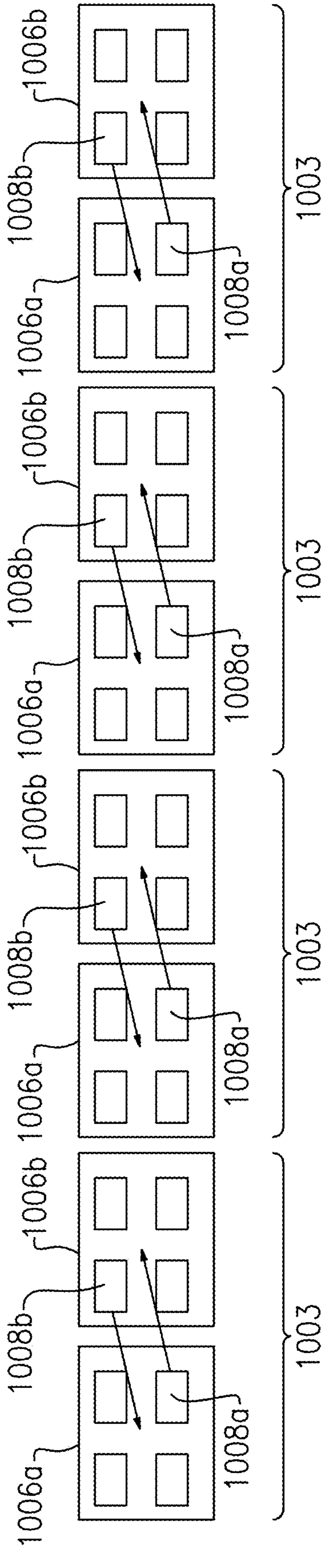
FIG. 11 is a schematic illustration of part of a semiconductor wafer according to an embodiment showing a plurality of dies arranged in pairs for testing.

FIG. 11 is a schematic illustration of part of a semiconductor wafer according to an embodiment showing a plurality of dies 1006*a*, 1006*b* arranged in pairs 1003 for testing. In each pair 1003, the left-hand die 1006*a* would use contact pad 1008*b* of the right-hand die 1006*b* to test or trim the left-hand die 106*a* and the right-hand die 1006*b* would use contact pad 1008*a* of the left-hand die 1006*a* to test or trim the right-hand die 106*b*. In a practical implementation of the embodiment of FIG. 11, each reticle field area (not shown) on the semiconductor wafer would be entirely made up of paired dies. This avoids the need to provide interconnections between reticle field areas for testing or trimming of dies in adjoining reticle field areas and avoids the problems caused by misalignment of reticle field areas. This arrangement is particularly advantageous for multi-site testing of semiconductor wafers.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A semiconductor wafer comprising:

a first die including a first integrated circuit having at least one trimmable or programmable component, the at least one trimmable or programmable component being configured to be trimmed or permanently altered in response to an electrical signal;

a second die arranged adjacent to the first die, the second die including a second integrated circuit, and at least one contact pad arranged to allow an electrical connection to be made to the second integrated circuit; and a first plurality of angled fingers connected to a first contact pad and a second plurality of angled fingers connected to a first trimmable or programmable component, the first plurality of angled fingers overlap the second plurality of angled fingers in an area between the first die and the second die, the overlap of first and second plurality of angled fingers providing electrical connection between the first contact pad and the first trimmable or programmable component, the overlap of the first and second plurality of angled fingers compensate for horizontal and vertical misalignment of the first contact pad and the first trimmable or programmable component.

2. The semiconductor wafer of claim 1 wherein the at least one contact pad of the second die is electrically connected to the at least one trimmable or programmable component of the first die by a conductor extending from the at least one contact pad to the at least one trimmable or programmable component.

3. The semiconductor wafer of claim 2 wherein the at least one contact pad of the second die is directly electrically connected to the at least one trimmable or programmable component of the first die by the conductor.

4. The semiconductor wafer of claim 2 wherein the at least one contact pad of the second die is electrically connected to the at least one trimmable or programmable component of the first die via trimming control circuitry.

5. The semiconductor wafer of claim 1 wherein the at least one trimmable or programmable component is a fuse or a one-time programmable device.

6. The semiconductor wafer of claim 1 wherein the at least one trimmable or programmable component is a memory.

7. The semiconductor wafer of claim 1 wherein the first integrated circuit further includes a plurality of trimmable or programmable components and the second die further includes a plurality of contacts pads, each contact pad of the second die being electrically connected to a respective trimmable or programmable component of the first die such that each contact pad of the second die is configured to act as a probe pad for its respective trimmable component.

8. The semiconductor wafer of claim 1 wherein the first and second dies have a rectangular shape, a long side of the second die being arranged adjacent and parallel to a long edge of the first die and at least one contact pad arranged parallel to a long edge of the second die is used to electrically connect to the at least one trimmable or programmable component of the first die.

9. The semiconductor wafer of claim 1 further comprising a plurality of dies arranged in a matrix or grid, the plurality of dies having a rectangular shape and each including a trimmable or programmable component, wherein contact pads arranged adjacent to long sides of the plurality of dies are electrically connected to a trimmable or programmable component in adjacent dies.

10. The semiconductor wafer of claim 1 further comprising a third die arranged adjacent to the first die on an opposing side of the first die to the second die, the third die including a third integrated circuit, and at least one contact pad arranged to allow an electrical connection to be made to the third integrated circuit, the at least one contact pad of the third die being additionally electrically connected to the at least one trimmable or programmable component of the first die such that the at least one contact pad of either the second die or the third die can be configured to act as at least one probe pad.

11. The semiconductor wafer of claim 1 wherein the first die further includes a supply voltage contact pad for providing a supply voltage to the first integrated circuit and a ground contact pad for providing an electrical ground for the first integrated circuit.

12. The semiconductor wafer of claim 1 wherein the first die further includes a control contact pad for providing at least one control signal to the first integrated circuit.

13. The semiconductor wafer of claim 1 comprising a first plurality of dies arranged in a first reticle field area and a second plurality of dies arranged in a second reticle field area, the first reticle field area being electrically connected to the second reticle field area by a conductive section.

14. The semiconductor wafer of claim 13 wherein the conductive section is arranged in a saw street between adjacent dies.

15. The semiconductor wafer of claim 13 wherein the conductive section includes a metal or metal alloy.

16. The semiconductor wafer of claim 13 wherein each die in each of the first and second reticle field areas is connected to an adjacent die by a conductive section.

17. The semiconductor wafer of claim 1 comprising a plurality of dies configured to be tested in pairs, each pair of dies including a first paired die and a second paired die, the first paired die being configured to be tested from the second paired die and the second paired die being configured to be tested from a first pair die.

18. A method of testing or trimming or programming a semiconductor wafer including a first die including a first integrated circuit having at least one trimmable or programmable component, the method comprising:

making an electrical connection to at least one probe pad, the at least one probe pad including a contact pad of a second die arranged adjacent to the first die, the contact pad of the second die being electrically connected to the at least one trimmable or programmable component of the first die;

overlapping a first plurality of angled fingers connected to a first contact pad with a second plurality of angled fingers connected to a first trimmable or programmable component, the first plurality of angled fingers overlap the second plurality of angled fingers in an area between the first die and the second die, the overlap of the first and second plurality of angled fingers providing electrical connection between the first contact pad and the first trimmable or programmable component, the overlap of the first and second plurality of angled fingers compensate for horizontal and vertical misalignment of the first contact pad the first trimmable or programmable component; and applying an electrical signal to the contact pad of the second die to trim or permanently alter an electrical characteristic of the at least one trimmable or programmable component.

19. The method of claim 18 further comprising a step of determining an electrical characteristic of the at least one trimmable or programmable component prior to the step of applying an electrical signal to the at least one probe pad.

20. The method of claim 18 wherein making an electrical connection to the at least one probe pad includes making an electrical connection to a contact pad of either a second die or a third die arranged adjacent to the first die and on opposing sides of the first die, the contact pad of the second die and third die being configured to act as the at least one probe pad and being electrically connected to the at least one trimmable or programmable component of the first die.

* * * * *